(12) United States Patent
Imai

(10) Patent No.: US 8,254,133 B2
(45) Date of Patent: Aug. 28, 2012

(54) POWER MODULE

(75) Inventor: Makoto Imai, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 232 days.

(21) Appl. No.: 12/663,813

(22) PCT Filed: Jun. 12, 2008

(86) PCT No.: PCT/JP2008/061181
§ 371 (c)(1),
(2), (4) Date: Dec. 9, 2009

(87) PCT Pub. No.: WO2008/153206
PCT Pub. Date: Dec. 18, 2008

(65) Prior Publication Data
US 2010/0172117 A1    Jul. 8, 2010

(30) Foreign Application Priority Data

Jun. 15, 2007 (JP) ................................. 2007-159243

(51) Int. Cl.
*H05K 1/14* (2006.01)
(52) U.S. Cl. ........................................ 361/736; 361/720
(58) Field of Classification Search .................. 361/720, 361/736, 748, 760
See application file for complete search history.

(56) References Cited

U.S. PATENT DOCUMENTS 5,943,216 A * 8/1999 Schmidt ........................ 361/761
6,282,077 B1 * 8/2001 Kijima ........................... 361/302

(Continued)

FOREIGN PATENT DOCUMENTS

JP    2001-197753 A    7/2001

(Continued)

OTHER PUBLICATIONS

"Development of the drive dozing prevention technique using the sensor installed in the sheet for detecting the driver's condition"; Shigehiko Kaneko, Prof., Dept. of Mechanical Engineeering, the University of Tokyo; Masato Enokizono, Prof., Dept. of Electrical & Elecgronic Engineering, Oita University; Tsutomu Kamei, Director, Shimane Institute of Health Science; Etsunori Fujita, Managing Director, Delta Tooling Co., Ltd., Mar. 31, 2007.

(Continued)

*Primary Examiner* — Hung S Bui
(74) *Attorney, Agent, or Firm* — Kenyon & Kenyon LLP

(57) ABSTRACT

Provided is a power module capable of welding a snubber capacitor without causing melting damage to a resin housing by welding heat. When leads of a snubber capacitor are respectively welded to upper surfaces of the specific portions of a P-pole bus bar and an N-pole bus bar, the welding heat generated at the specific portions of the P-pole bus bar and the N-pole bus bar is respectively radiated from openings, through which the lower surfaces of the specific portions of the P-pole bus bar and the N-pole bus bar are exposed. As a result, the snubber capacitor can be later appended by welding without causing melting damage to the resin housing due to the welding heat. During welding, a separate cooling head is inserted into the openings to forcibly cool the lower surfaces of the specific portions of the P-pole bus bar and the N-pole bus bar respectively, so that the melting damage to a resin housing can be more reliably avoided.

3 Claims, 3 Drawing Sheets

U.S. PATENT DOCUMENTS

| | | | | |
|---|---|---|---|---|
| 6,323,440 | B1 * | 11/2001 | Maruyama et al. | 174/262 |
| 6,625,031 | B2 * | 9/2003 | Sano et al. | 361/737 |
| 6,900,986 | B2 * | 5/2005 | Kimoto et al. | 361/704 |
| 7,154,753 | B2 * | 12/2006 | Kobayashi | 361/715 |
| 7,177,128 | B2 * | 2/2007 | Yamamoto et al. | 361/91.7 |
| 7,186,120 | B2 * | 3/2007 | Saka | 439/76.2 |

FOREIGN PATENT DOCUMENTS

| | | |
|---|---|---|
| JP | 2002-078159 A | 3/2002 |
| JP | 2005-94882 A | 4/2005 |
| JP | 2006-32775 A | 2/2006 |
| JP | 2006-086438 A | 3/2006 |
| JP | 2007-273884 A | 10/2007 |

OTHER PUBLICATIONS

Sosnowski, M., et al.: "Repeat Return Map Distinguishes Patients in the Chronic Phase after Miocardial Infarction with Different Risk for Future Cardiac Events"; Computers in Cardiology, 1995, 1995 IEEE, pp. 285-288.

* cited by examiner

POWER MODULE

This is a 371 national phase application of PCT/JP2008/061181 filed 12 Jun. 2008, claiming priority to Japanese Patent Application No. JP 2007-159243 filed 15 Jun. 2007, the contents of which are incorporated herein by reference.

TECHNICAL FIELD

The present invention relates to a power module including a configuration in which a bus bar for connecting a switching element to a power source is inserted into a resin housing.

BACKGROUND ART

In general, a power module with a switching element which handles a large amount of power, such as an IGBT (Insulated Gate Bipolar Transistor), normally includes a configuration in which a bus bar for connecting a switching element to a power source is inserted into a resin housing so as to secure insulation of the power module.

Such a power module is connected to a snubber capacitor (smoothing capacitor) for suppressing surge voltage of the switching element (e.g., see Japanese Unexamined Patent Application Publication No. 2006-086438). Here, Japanese Unexamined Patent Application Publication No. 2006-086438 discloses the configuration in which the snubber capacitor (smoothing capacitor) is connected at the exterior of the power module.

DISCLOSURE OF THE INVENTION

Accordingly, since the snubber capacitor is connected at the exterior of the power module in the related art disclosed in Patent Document 1, the distance between the snubber capacitor and the switching element inside the power module is increased. As a result, the snubber capacitor is likely to insufficiently fulfill the function of suppressing the surge voltage of the switching element.

Indeed, such a concern is solved by connecting the snubber capacitor to a bus bar in the inside of the power module. However, there is a problem that since the bus bar in the inside of the power module is generally inserted into the resin housing, the resin housing near the bus bar is molten and damaged due to welding heat when the snubber capacitor is connected to the bus bar by welding.

Therefore, an object of the invention is to provide a power module capable of welding a snubber capacitor without causing melting damage to a resin housing by welding heat.

The power module according to the invention is a power module characterized in that a bus bar for connecting a switching element to a power source is inserted into a resin housing, and a lead of the snubber capacitor for suppressing surge voltage of the switching element is welded to an upper surface of a specific portion of the bus bar, wherein at least the resin housing is provided with an opening, through which a lower surface of the specific portion of the bus bar is exposed.

With the power module according to the invention, when the lead of the snubber capacitor is welded to the upper surface of the specific portion of the bus bar, the welding heat generated at the specific portion of the bus bar is radiated from the opening through which the lower surface of the specific portion of the bus bar is exposed. During welding, a separate cooling member can be inserted into the opening to forcibly cool the lower surface of the specific portion of the bus bar.

BEST MODE FOR CARRYING OUT THE INVENTION

A preferable embodiment of a power module according to the invention will now be described with reference to the drawings. In the reference drawings, FIG. 1 is a longitudinal cross-sectional view schematically showing the configuration of a power module according to an embodiment of the invention.

Figure 1:
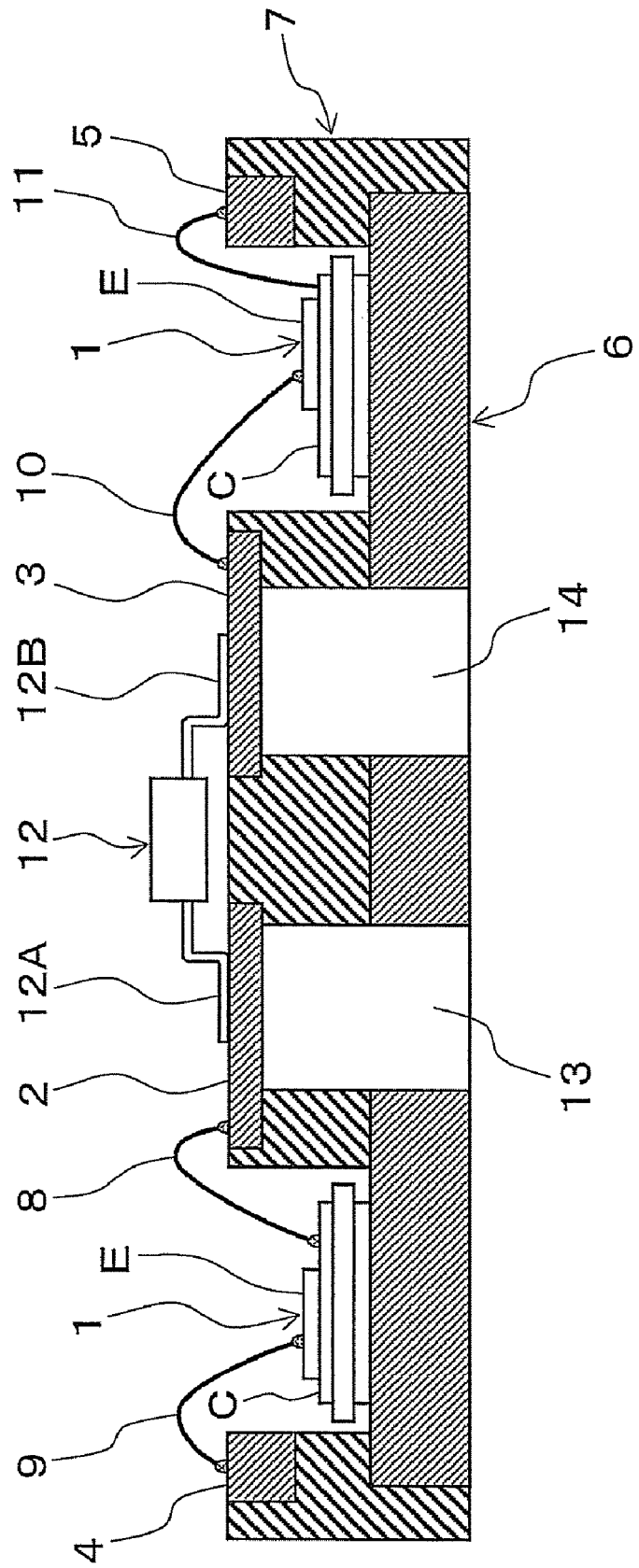
FIG. 1 is a longitudinal cross-sectional view schematically showing the configuration of a power module according to an embodiment of the invention.

As shown in FIG. 1, the power module according to one embodiment of the invention includes a plurality of switching elements 1 constituting a bridge circuit, a P-pole bus bar 2 and an N-pole bus bar 3 for connecting the respective switching elements 1 to a power source, and an output bus bar 4 and an output bus bar 5 for extracting an output from the respective switching elements 1.

Each of the switching elements 1 is constituted by an IGBT (Insulated Gate Bipolar Transistor) handling a large amount of power, in which an emitter E is stacked on a collector C. In this instance, a gate is not shown in the drawings. The switching elements 1 are respectively installed on a heat radiation plate 6 made of a thick plate in the vicinity of both right and left ends of the heat radiation plate.

The heat radiation plate 6 is overmolded with a resin housing 7, except for an installed portion of the respective switching elements 1. The P-pole bus bar 2, the N-pole bus bar 3, the output bus bar 4 and the output bus bar 5 are respectively inserted into the resin housing 7 in one piece.

The P-pole bus bar 2 and the N-pole bus bar 3 are made of, for example, a thick copper plate, and are arranged in a bilateral symmetry in the vicinity of a central portion of the resin housing 7 in a horizontal direction. Meanwhile, the output bus bar 4 and the output bus bar 5 are made of, for example, a copper rod of an angular shape, and are installed in the vicinity of both ends of the resin housing 7 in a horizontal direction thereof.

In the switching element 1 disposed in the vicinity of the left end of the heat radiation plate 6, the collector C is electrically connected to the P-pole bus bar 2 via a bonding wire 8, and the emitter E is electrically connected to the output bus bar 4 via a bonding wire 9.

Meanwhile, in the switching element 1 disposed in the vicinity of the right end of the heat radiation plate 6, the emitter E is electrically connected to the N-pole bus bar 3 via a bonding wire 10, and the collector C is electrically connected to the output bus bar 5 via a bonding wire 11.

Here, in order to suppress the surge voltage applied to the respective switching elements 1, the snubber capacitor 12 constituted by a ceramic capacitor having heat resistance is connected between the P-pole bus bar 2 and the N-pole bus bar 3. That is, one lead 12A of the snubber capacitor 12 is later appended to an upper surface of a specific portion of the P-pole bus bar 2 by welding. In a similar fashion, the other lead 12B of the snubber capacitor 12 is later appended to an upper surface of a specific portion of the N-pole bus bar 3 by welding.

As the configuration for this purpose, one opening 13 is formed to extend over the heat radiation plate 6 and the resin housing 7 to expose the lower surface of the specific portion of the P-pole bus bar 2 and thus radiate the heat. In a similar fashion, the other opening 14 is formed to extend over the heat radiation plate 6 and the resin housing 7 to expose the lower surface of the specific portion of the N-pole bus bar 3 and thus radiate the heat.

Here, the one opening 13 and the other opening 14 are respectively formed in the shape of a circular cross section, but the cross section is not limited to the circular shape. The cross section may assume other shape such as an oval or a rectangle.

In the power module including the above-described configuration according to the embodiment, for example, by electron beam welding, one lead 12A of the snubber capacitor 12 is welded to the upper surface of the P-pole bus bar 2, and the other lead 12B is welded to the upper surface of the specific portion of the N-pole bus bar 3.

In this instance, since the welding heat generated at the specific portion of the P-pole bus bar 2 is radiated from the one opening 13 through which the lower surface of the specific portion of the P-pole bus bar 2 is exposed, the resin housing 7 in the vicinity of the P-pole bus bar 2 is not molten and damaged due to the welding heat. In a similar fashion, since the welding heat generated at the specific portion of the N-pole bus bar 3 is radiated from the other opening 14 through which the lower surface of the specific portion of the N-pole bus bar 3 is exposed, the resin housing 7 in the vicinity of the N-pole bus bar 3 is not molten and damaged due to the welding heat.

Therefore, with the power module according to the embodiment, it is possible to later append the snubber capacitor 12 by welding without causing melting damage to the resin housing 7 by the welding heat.

Figure 2:
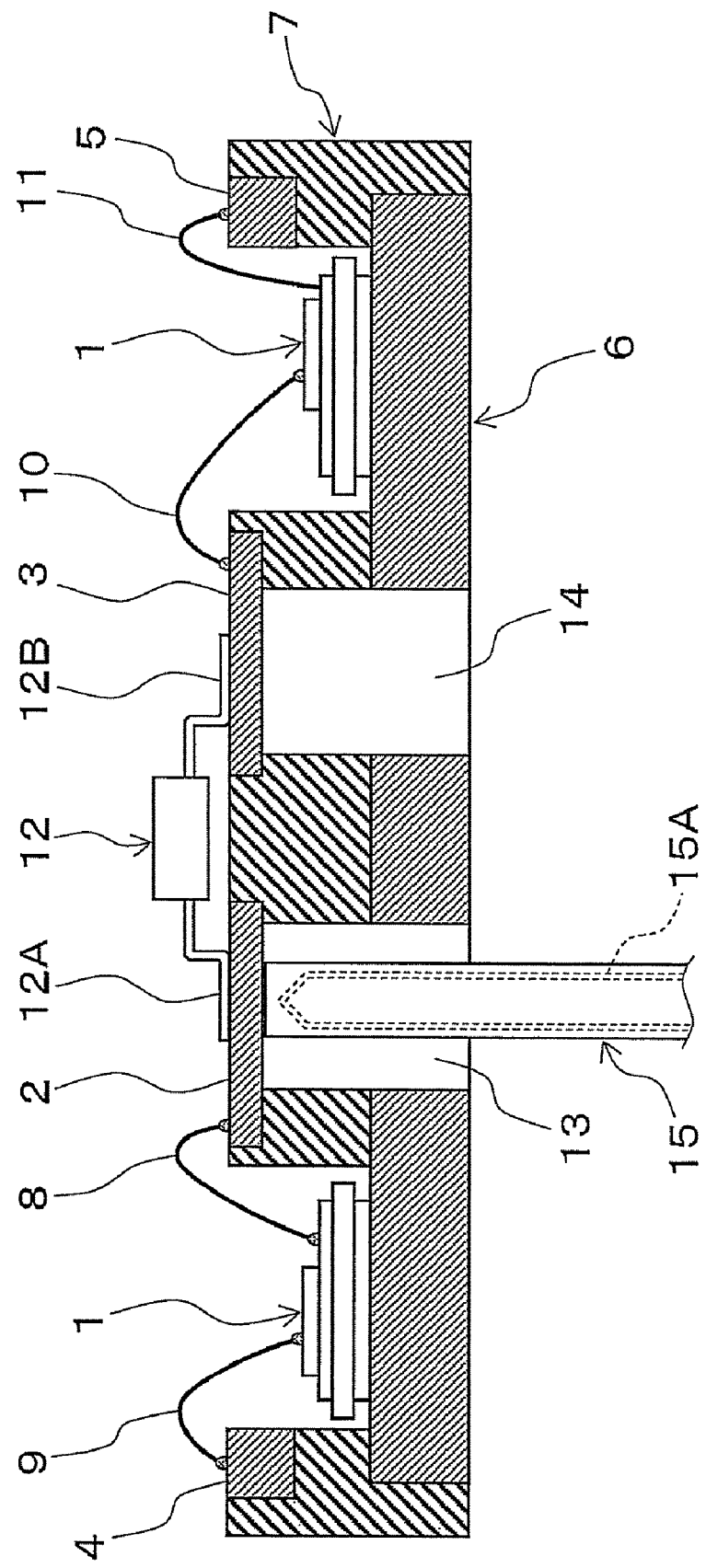
FIG. 2 is a longitudinal cross-sectional view similar to FIG. 1 to show the state where a cooling head for forcibly cooling the P-pole bus bar and the N-pole bus bar shown in FIG. 1 is inserted into one opening of the P-pole bus bar side.

Here, when the one lead 12A of the snubber capacitor 12 is welded to the upper surface of the specific portion of the P-pole bus bar 2, if the lower surface of the specific portion of the P-pole bus bar 2 is forcibly cooled by a cooling head (cooling member) 15 shown in FIG. 2 inserted into the one opening 13, it is possible to reliably avoid the melting damage to the resin housing 7 in the vicinity of the P-pole bus bar 2.

In a similar fashion, when the other lead 12B of the snubber capacitor 12 is welded to the upper surface of the specific portion of the N-pole bus bar 3, if the lower surface of the specific portion of the N-pole bus bar 3 is forcibly cooled by the cooling head 15 inserted into the other opening 14, it is possible to reliably avoid the melting damage to the resin housing 7 in the vicinity of the N-pole bus bar 3.

Here, the cooling head 15 shown in FIG. 2 has an external appearance formed in the shape of a rod having a small diameter, in which a circulation passage 15A for cooling water which is sent under pressure from a cooling device (not shown) is formed. An upper end surface of the cooling head is formed with a flat surface.

Figure 3:
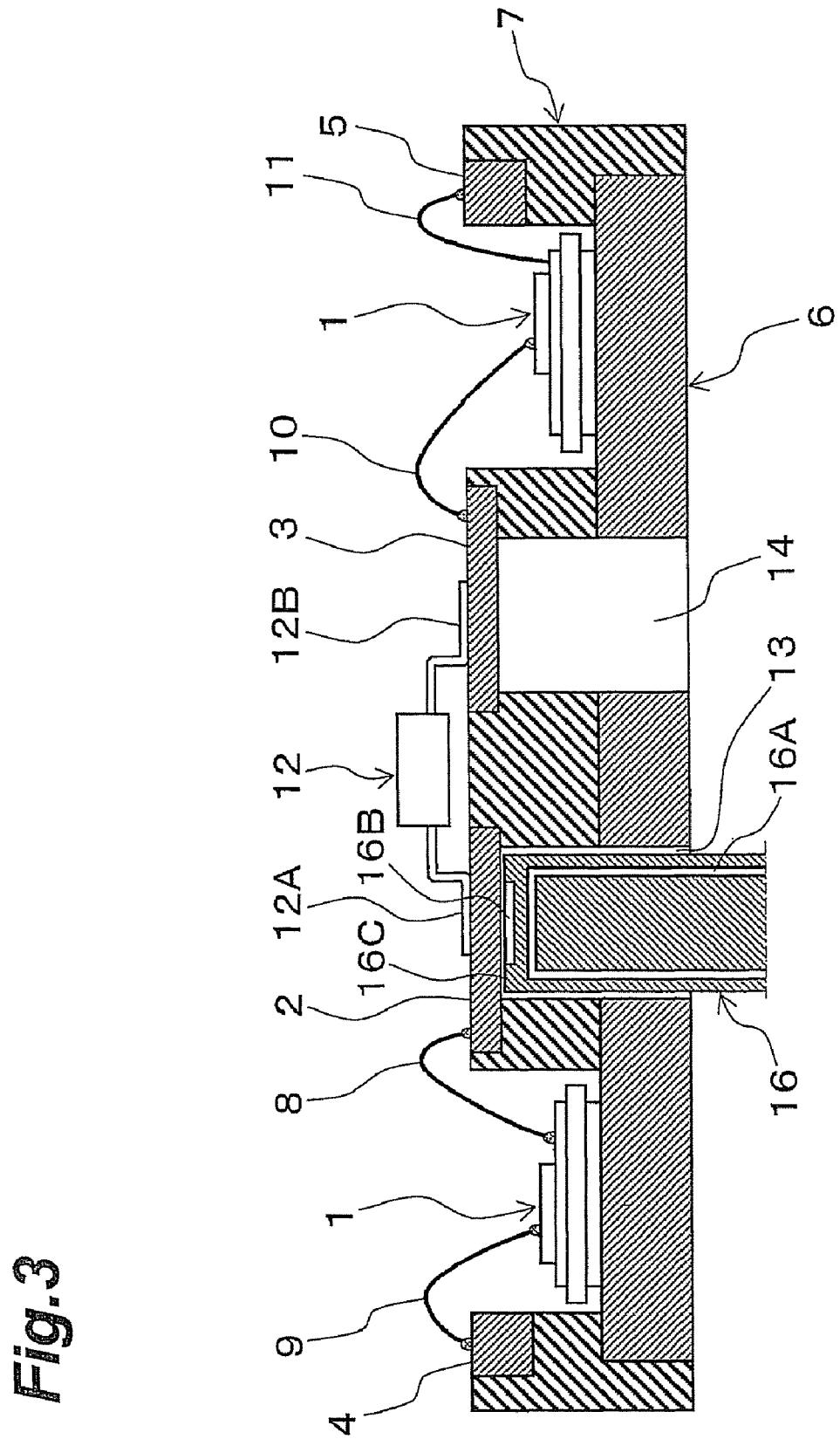
FIG. 3 is a longitudinal cross-sectional view similar to FIG. 2 to show a modification of the cooling head shown in FIG. 2.

In this instance, the cooling head 15 shown in FIG. 2 may be changed into a cooling head (cooling member) 16 shown in FIG. 3. The cooling head 16 has an external appearance formed in the shape of a rod having a small diameter, in which a circulation passage 16A for cooling water which is sent under pressure from a cooling device (not shown) is formed, similar to the cooling head 15 shown in FIG. 2, but the outer diameter of the cooling head is formed to have a large diameter slightly smaller than, for example, a diameter of the one opening 13. The cooling head 16 is provided with a circular recessed portion 16B on a flat upper surface of the cooling head 16, and a ring-shaped cooling protrusion 16c is formed around the circular recessed portion.

Here, for example, with the cooling head 16 inserted into the one opening 13 of the P-pole bus bar 2 side, the circular recessed portion 16B faces the lower surface of the specific portion of the P-pole bus bar 2 to which the one lead 12A of the snubber capacitor 12 is welded, and the cooling protrusion 16C around the recessed portion forcibly cools the lower surface in the vicinity of the specific portion of the P-pole bus bar 2.

Accordingly, if the cooling head 16 is used, the one lead 12A and the other lead 12B of the snubber capacitor 12 can be reliably welded to the upper surface of the specific portions of the P-pole bus bar 2 and the N-pole bus bar 3, respectively. In addition, it is possible to reliably prevent the resin housing 7 in the vicinity of the P-pole bus bar 2 and the N-pole bus bar 3 from being molten and damaged.

Industrial Applicability

According to the invention, when the lead of the snubber capacitor is welded to the upper surface of the specific portion of the bus bar, since the welding heat generated at the specific portion of the bus bar is radiated from the opening through which the lower surface of the specific portion of the bus bar is exposed, the snubber capacitor can be later appended to the bus bar by welding without causing the melting damage to the resin housing by the welding heat. Since the lower surface of the specific portion of the bus bar is forcibly cooled by the separate cooling member inserted into the opening during welding, it is possible to reliably avoid the melting damage to the resin housing.

The invention claimed is:

1. A power module comprising:
   a bus bar that is inserted into a resin housing to connect a switching element to a power source; and
   a snubber capacitor that suppresses surge voltage of the switching element and has a lead welded to an upper surface of a specific portion of the bus bar,
   wherein at least the resin housing is provided with an opening, through which a lower surface on the side of the bus bar that is opposite to the upper surface of the specific portion of the bus bar is exposed.

2. The power module of claim 1, further comprising a cooling head or cooling member positioned in the opening.

3. The power module of claim 2, wherein the cooling head or cooling member includes a circulation passage for circulating water.

\* \* \* \* \*